(12) United States Patent
Laksin et al.

(10) Patent No.: US 7,836,588 B2
(45) Date of Patent: Nov. 23, 2010

(54) METHOD FOR FABRICATING AN ELECTRONIC DEVICE

(75) Inventors: Mikhail Laksin, Boonton, NJ (US); Subhankar Chatterjee, Hampton, NJ (US)

(73) Assignee: Ideon LLC, Hillsborough, NJ (US)

( * ) Notice: Subject to any disclaimer, the term of this patent is extended or adjusted under 35 U.S.C. 154(b) by 754 days.

(21) Appl. No.: 11/772,413

(22) Filed: Jul. 2, 2007

(65) Prior Publication Data

US 2008/0120834 A1    May 29, 2008

Related U.S. Application Data

(60) Provisional application No. 60/806,722, filed on Jul. 6, 2006.

(51) Int. Cl.
*H05K 3/02* (2006.01)

(52) U.S. Cl. ............... 29/847; 29/601; 29/832; 216/65

(58) Field of Classification Search ............ 29/600, 29/601, 825, 830, 832, 84, 846, 847, 840; 174/255, 261, 260; 205/125; 216/51, 65; 361/761; 428/209

See application file for complete search history.

(56) References Cited

U.S. PATENT DOCUMENTS 5,042,145 A * 8/1991 Boucquet ............... 361/761
6,355,598 B1 * 3/2002 Takeda et al. ........... 428/209
7,299,546 B2 * 11/2007 Tuominen et al. ........ 29/832
2002/0135519 A1   9/2002 Luch

FOREIGN PATENT DOCUMENTS

DE    19951721 A1    6/2000

* cited by examiner

*Primary Examiner*—Donghai D. Nguyen
(74) *Attorney, Agent, or Firm*—Roberts & Roberts, LLP

(57) ABSTRACT

The invention provides an article and process for producing electronic devices. More particularly the invention relates to an article and process for fabricating patterns of electrically conductive materials on non-electrically conductive substrates by laser ablation. Such an article and process find use in the production of RDIF devices, antennae, electrical circuits, microwave susceptors, contacts, leads, conductors, interactive displays, electrostatic shielding devices and the like. The process involves first providing an electrically conductive metal layer on an electrically non-conductive substrate. Then an electronic circuit is electrically connected to the electrically conductive metal layer. Thereafter a portion of the electrically conductive metal layer is ablated with infrared laser radiation to form a pattern of electrically conductive areas and electrically non-conductive areas on the substrate, wherein at least a portion of the electrically conductive areas are electrically connected to the electronic circuit.

17 Claims, 2 Drawing Sheets

FIG. 1 (a) PRIOR ART

METHOD FOR FABRICATING AN ELECTRONIC DEVICE

CROSS REFERENCE TO RELATED APPLICATION

This application claims the benefit of U.S. Provisional patent application Ser. No. 60/806,722, filed Jul. 6, 2006, which is incorporated herein by reference.

BACKGROUND OF THE INVENTION

1. Field of the Invention

The present invention relates to an article and process for producing electronic devices. More particularly the invention relates to an article and process for fabricating patterns of electrically conductive materials on non-electrically conductive substrates by laser ablation. Such an article and process find use in the production of RFID devices, antennae, electrical circuits, microwave susceptors, contacts, leads, conductors, sensors, interactive displays, electrostatic shielding devices, heating elements and the like.

2. Description of the Related Art

There is great commercial interest in a new generation of data transmitting electronic devices such as transponders, sensors, etc. The use of electronic components in everyday items, particularly in packaging, in the form of traceable tags, heating elements, security elements, sensors etc, is growing rapidly.

Recently, Radio Frequency Identification Devices or RFID's have found use in providing tagging and traceability for the packaging industry. RFID refers to technologies that use radio waves to identify and transmit information remotely from tagged objects. In a typical RFID tag, a microchip is attached to an antenna. The antenna is typically made of conductive metal, e.g., silver, copper, etc., and can have various shapes and geometries based on the radio frequency used. The chip and the antenna together constitute an RFID transponder or a tag. The chip contains the necessary information for identifying a tagged item. The function of the antenna is to communicate remotely through radio wave signals from a reader and establish the identity of the object. The ability to remotely monitor the flow of items from one place to another makes RFID an attractive technology. Its use in inventory control, security, etc. for packaged goods has serious financial ramifications. The ultimate goal is to implement an item level tagging. However, there are several roadblocks to the commercial use of RFID technology. A key factor is the inability to mass produce tags with required functionalities in a simple, reliable, and consistent manner, and producing them cost effectively, for making widespread applications feasible. At present, the cost of RFID transponders ranges from 50 cents to several dollars each, depending on their functional requirements. However, for item level tagging to be feasible, which would require billions of tags, the cost of the transponders has to be significantly less. Unfortunately, the currently available methods of tag manufacturing are not capable of meeting these requirements and therefore, the industry and the market, are at a stand still. The cost of a transponder is primarily dictated by (1) the cost of the antenna (2) the cost of the base material used (3) the cost of the chip (4) the cost of fabrication (5) the cost of quality control (6) the final yield value and (7) the overall capital investment required. The cost of the antennae has been identified to be one of the key limiting variables and therefore, an intense effort is being made to overcome this problem. Currently a method of chemical etching is used to produce an antenna from a conductive metal base. The process involves selective chemical etching of a conductive metal like silver or copper, with a strong acid or base to produce antennae of selective geometries. In subsequent multiple steps the antenna is attached to a chip via a conductive adhesive and is encased in an appropriate casing. The process is old, well understood and broadly practiced, however, wasteful, environmentally harmful, expensive, and therefore it is not able to take the industry to the next level. Several other methods e.g., metal stamping, selective electrolytic metal deposition, etc. have been tried as alternatives. However, none has been successful as a solution.

It is known in the art to produce electronic devices such as antennae by a technique generally described as "plating on plastics" The "plating on plastics" technology deposits an adherent coating of a metal or metal-based material onto the surface of a plastic substrate. "Plating on plastic" envisions the deposition of an initial metal coating using "electroless" plating followed by an optional deposition of metal using electrodeposition. Electroless plating involves chemically coating a nonconductive surface such as a plastic with a continuous metallic film. In this regard, U.S. Patent Application 20020135519 describes a radio frequency identification device (RFID) and many different ways of manufacturing such RFID antennae and transponders. An RFID transponder device is essentially composed of a small antenna attached to a programmable computer chip. Such transponders are required for transmitting electromagnetic radiation between the device and its surroundings, e.g., a reader or negotiator. Together, a transponder and a reader constitute a working RFID system. An RFID transponder may be passive, which can be used for transmission short range transmission. However, they may also be active and used for longer range transmission when a battery is attached to the transponder. Typically an RFID antenna is a flat metallic structure comprising of conductive and non-conductive areas. Its appropriate geometrical form is dictated by the frequencies used by the readers, typically in the kilohertz to megahertz ranges. An active or passive transponder is typically encased in a plastic laminated structure, e.g., a label, which is then attached to a pallet, case or boxes to obtain non-contact and remote "tag and traceability" features for inventory control, logistics, security and various other functions. However, most of the solid state electronic circuitry is rigid and therefore, not suitable for use on packaging items, as most such items are flexible materials. Therefore, a tremendous amount of effort is being used developing so called "printed electronics." The goal of printed electronics is to print the required elements of an electrical circuitry onto the flexible substrate itself. The printed substrate with required elements can then be put onto the finished packaging as an added label, or as part of the packaging itself, or the item itself, thereby imparting the appropriate functionalities to the packaging and packaged items.

An essential element of an electronic circuit is geometric patterns of conductive and nonconductive (dielectric) areas. Typically this is done in a semiconductor circuit via the doped metal layers and dielectric layers. In a printed circuit, printing inks made with conductive particles, typically silver, are printed in respective patterns on a nonconductive (dielectric) film surface. Majority of commercially manufactured antennas today are based on selective chemical etching of metals in appropriate geometries. However, this process poses serious environmental and health and safety hazards.

Recently printing of RFID antennae with conductive inks is being developed as an environmentally friendly approach. Typically, inks containing expensive metals like silver powder, are printed onto dielectric substrates, e.g., plastic or paper, forming a conductive pattern. After printing, the printed structure requires a high temperature annealing process to sinter all the conductive particles together and form continuous conductive elements, in order to achieve necessary levels of conductivity. This limits the number of substrates that can be used to print on, since only expensive substrates with high softening temperature may be used to avoid any deformation. High temperature requirement also seriously reduces the overall productivity of the process. In addition, certain amount of ink film thickness must be deposited in order to obtain required conductivity levels. Moreover, due to high loading of silver powder requirement, the ink formulations must contain extraneous additives, including volatile organic compounds (VOC), to produce inks in a printable fashion. This makes the inks either less conductive or environmentally unfriendly. Printing of a substrate surface with a metal catalyst or "seed layer" and subsequent electrodeposition of copper metal in a bath onto the printed areas is another approach that is being studied. Although this process avoids any high temperature processing, it is a slow and wet process, with their inherent disadvantages.

German Patent DE 19951721 teaches a process of selective ablation of a thin, less than 250 nm metal layer, with UV lasers emitting between 248 nm and 532 nm. After ablation an additional step of metal electrodeposition is required in order to achieve required electrical conductivity. While this approach promises to yield silver free, less expensive antennae, the productivity of such process is very low since UV laser irradiation has a limited energy level for ablating thicker metal layers and electrodeposition process is extremely slow and requires utilization of wet chemistry.

All of these prior approaches also require subsequent multiple steps to convert the formed antennae into actual functional transponders. For example, a programmable computer chip must be attached to the antenna in a precise manner to obtain appropriate connection to the circuitry. Lack of connection would further reduce the yield of the process and above all, reliability of the transponders itself. For transponders with longer ranges, a battery must also be attached in a subsequent step.

Overall, the limitations of all the current and available approaches make the RFID antennae and transponders produced expensive, and limit their viability as commercially successful processes to satisfy projected industry needs for billions of inexpensive RFID transponders, for all types of applications including tagging of individual items. Similarly, commercial manufacturing of microwave susceptors or sensors also face similar limitations. These industries require a new, efficient, effective, environmentally friendly, robust, economical, and reliable manufacturing process to achieve their projected growth potentials.

At present the industry is focused on developing a printing method as a solution to this quandary. An ink made with conductive metal powder is printed on a flexible web substrate in the form of an antenna pattern. Next the printed patterns are heated to a high temperature, e.g., 130° C., to anneal the metal particles and form a continuous and conductive pathway. Subsequently, a suitable chip is attached in-line to the antenna via a conductive adhesive; quality controlled for right contacts and functionality, and the structure encased in an appropriate package for final assembly. However, this approach is complex. In order to achieve a high enough conductivity at printed film thickness, mainly silver is used as metal, which is expensive. The metal must also be in powder form with particle size ranging from micrometer to nanometer with their associated processing cost, further increasing the material cost. The substrate must be able to withstand high bake temperature ~130° C. without thermal distortion, and therefore can primarily be expensive polyesters with high glass transition temperature (Tg). High web surface temperature requirement also slows down the overall printing process, increasing cost.

In order to convert the metal powder to an ink composition, resins, solvents, additives etc. must be added, most of which being non-conductive are not desired to remain with the printed antennae. Therefore, materials are selected which would volatilize during the baking step, which in turn create undesired environmental (VOC) and health & safety issues. In addition, despite the high heating step, the metal particles in the printed antenna simply do not attain their original metallic crystal structure and therefore results in printed antennae with somewhat reduced metal conductivity compared to their original value.

Attachment of computer chips onto the printed antennae is also a critical step. The chip connectors must be properly aligned right onto the antenna pads for appropriate coupling. Any misalignment would increase waste factor and above all would increase unreliability of the system, increasing potential risks and security breaches in several sensitive application areas. In order to minimize such risk factors "straps," which are webs containing pre-positioned chips, can be positioned and aligned in a film lamination arrangement and chips transferred from the "strap" to the printed antenna web in-line. However, even with this approach there is at least 1-3% unreliability factor, which for mass adoption poses a great disadvantage.

The overall complexity, unreliability and economics of the current "printed antenna" process simply does not lend itself to be a solution to preventing the RFID market from achieving intended commercial success and there is a serious need for a new fabrication method for RFID antenna. The present invention discloses such an RFID antenna manufacturing process. The invented process starts with a metallized film which is provided with several computer chips in any pre-determined pattern via a conductive adhesive. This step can be done in-line or off-line. Next, an infrared (IR) laser ablates a portion of the metal layer in a predetermined manner to create an appropriate antenna form. A CAD/CAM or similar computer-hardware interface software can direct this exposure step. The process offers an increased in creating almost any possible antenna shape or form in one step. Since there is no baking step involved, an expensive high Tg film is no longer necessary. The metal layer can be almost any thin conductive metal layer, e.g., aluminum, silver, copper etc. However, a metallized Al layer is the most economical. The thickness of the Al layer can be adjusted easily to obtain a desired level of conductivity.

The present invention for mass manufacturing RFID devices avoids the roadblocks faced by the printing approach. The process does not require an expensive substrate, expensive conductive inks, no heat is required, no wet chemistry is involved and does not produce any VOC and/or health and safety issues. The process does not require a separate step of attaching computer chips to the formed antenna, thereby significantly improving the reliability, yield and robustness of the manufacturing process. The individual RFID devices, i.e., an antenna attached to a chip can be packaged in-line to produce a finished RFID tag in one single step.

Geometric patterns produced may be "passive," e.g., an antenna for radio frequency identification device (RFID); a microwave susceptor; a circuit etc. They can also be "active" or "functional," e.g., a complete transponder for RFID or a sensor or similar devices, when a metallized substrate, pre-fabricated with computer chip and a battery, is ablated. Any geometric form on a flat surface can be produced in a sheet or roll form. The conductive articles can be folded into a three dimensional architecture. Such production of fully active or passive devices, with high reliability and in high yield, produced in one step, is unique.

SUMMARY OF THE INVENTION

The invention provides a process for producing an electronic device which comprises,
a) providing an electrically conductive metal layer on an electrically non-conductive substrate;
b) thereafter electrically connecting an electronic circuit to the electrically conductive metal layer; and
c) thereafter ablating a portion of the electrically conductive metal layer with infrared laser radiation to thereby form a pattern of electrically conductive areas and electrically non-conductive areas on the substrate, wherein at least a portion of the electrically conductive areas are electrically connected to the electronic circuit.

The invention also provides an article for producing an electronic device which comprises an electrically non-conductive substrate, a continuous, unpatterned, electrically conductive metal layer on the electrically non-conductive substrate, a continuous, unpatterned, infrared radiation sensitive composition layer between the electrically non-conductive substrate and the electrically conductive metal layer, and an electronic circuit electrically connected to the electrically conductive metal layer.

The invention also offers an alternative to the "printed electronics" approach to form electronic circuitry or devices.

BRIEF DESCRIPTION OF THE DRAWINGS

FIG. 1(a) and FIG. 1(b) illustrate a prior art technique for forming a microchip on a substrate.

DESCRIPTION OF THE INVENTION

Figure 1B:
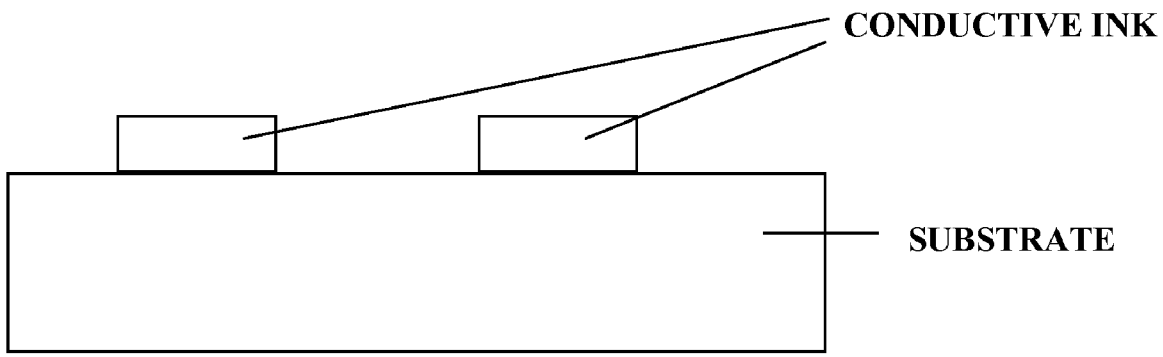
Figure 1B:
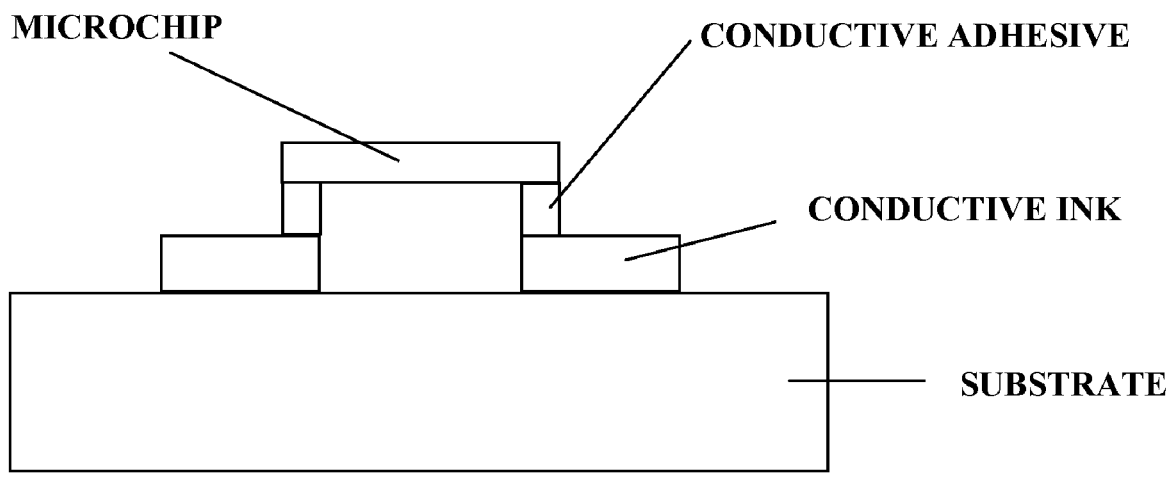
Figure 2:
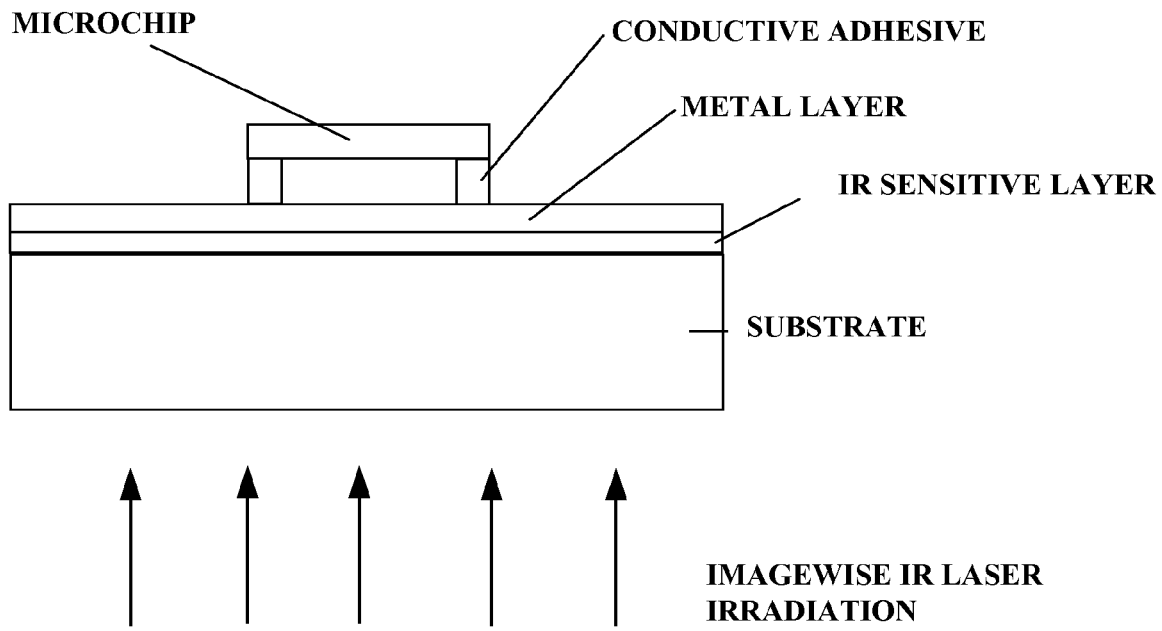
FIG. 2 shows a schematic representation of a microchip adhered, via a conductive adhesive, to an article for producing an electronic device according to the invention, during IR laser irradiation.
Figure 3:
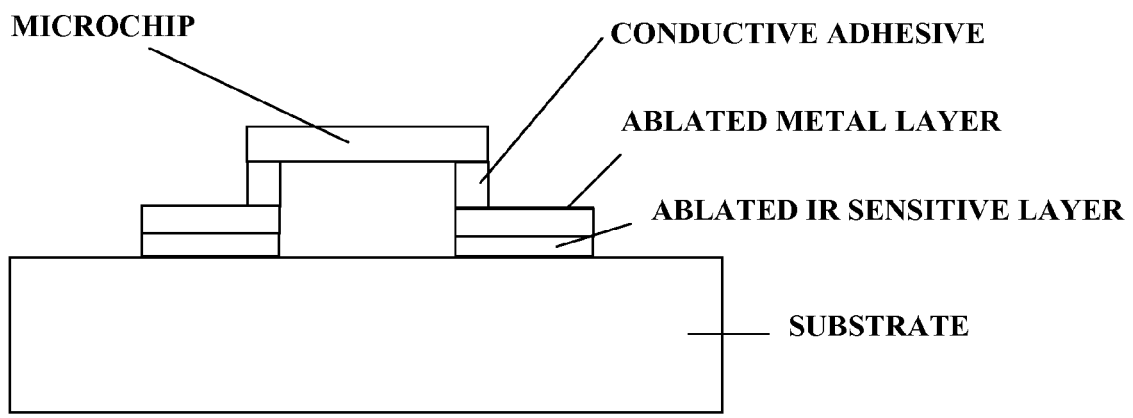
FIG. 3 shows a schematic representation of a microchip adhered, via a conductive adhesive, to an article for producing an electronic device according to the invention, after IR laser irradiation.

FIG. 1(a) and FIG. 1(b) illustrate a prior art technique for forming a microchip on a substrate. A nonconductive substrate is imagewise printed with a conductive ink. Then a conductive adhesive is printed on the substrate and a microchip placed on the conductive adhesive via a robotic arm. This technique requires the use of several, slow, unreliable steps which results in a high rejection rate. FIG. 2 and FIG. 3 illustrate the present invention wherein a nonconductive substrate is applied with an full electrically conductive metal layer, and an optional but preferred intermediate IR sensitive layer. A microchip is set onto the metal layer via a conductive adhesive, however, since the metal layer is not pre-patterned, the degree of microchip placement precision on the metal layer is not as great and defects are fewer. FIG. 2 shows laser irradiation through the substrate and IR sensitive layer resulting in an ablation of the nonimage portions of the IR sensitive layer and the metal layer under the conductive adhesive and microchip. Since the imagewise laser irradiation is closely controllable, the ablated areas are removed with a high degree of precision. The invention provides a fast, efficient, effective, environmentally friendly, economical and reliable method of manufacturing electronic devices such as conductive antennas, transponders, microwavable patterns, circuits, sensors and similar devices.

In a first step, a conductive article is provided which comprises an electrically nonconductive substrate and an electrically conductive metal layer on the electrically nonconductive substrate. Preferably the electrically conductive metal layer is continuous and substantially unpatterned. Useful substrates nonexclusively include films of a polymer, paper, glass, or combinations thereof.

Various organic plastic substrates are available having suitable properties for the invention. Illustrative examples includes cellulose derivatives such as cellulose nitrate, cellulose acetate, regenerated cellulose and cellulose ethers such as ethyl and methyl cellulose; polystyrene plastics such as polystyrene and polymers and copolymers of various ring substituted styrenes, for example o-, m- and p-methylstyrene and other ring-substituted styrenes as well as side-chain substituted styrenes such as alpha-, methyl- and ethylstyrene and various other polymerizable and copolymerizable vinylidenes; various vinyl polymers and copolymers such as polyvinyl butyral and other acetals, polyvinyl chloride, polyvinyl acetate and its hydrolysis products, polyvinyl chloride-acetate copolymers; acrylic resins such as polymers and copolymers of methyl acrylate, methyl methacrylate, acrylamide, methylolacrylamide and acrylonitrile; polyamide, polyphenylene sulfide, polyetheretherketone, polyetherketone, polyketone, polyetherimide, polysulfone, polyethersulfone, polyaryletherketone, polyurethane, polyethylene napthalate, polybutylene terephthalate), polyethylene terephthalate, polyamide, polycarbonate, COC, polyoxymethylene, acrylonitrile butadiene styrene, polyvinylchloride, polyphenylene, polyethylene, ethylene/tetrafluoroethylene, (polytetrafluoroethylene, polyesters and unsaturated-modified polyester resins such as those made by condensation of polycarboxylic acids with polyhydric phenols or modified using unsaturated carboxylic acid and further modified by reacting the alkyd with another monomer; polymers of allyl diglycol carbonate. Practical substrates comprise nitrocellulose, polyurethane, polyester, polyolefins, epoxy, acrylic, amide, vinyl, or combinations thereof. Preferred substrates include polyethylene terephthalate and polypropylene. In a preferred embodiment, the substrate is substantially transparent, in particular, substantially transparent to infrared radiation. The substrate has a thickness which is at least sufficient to maintain its integrity as a self-sustaining film. In one embodiment the substrate has a thickness of from about 5 μm to about 700 μm, preferably from about 12 μm to about 100 μm, and more preferably from about 10 μm to about 50 μm.

Optionally, but preferably, applied to one surface of the substrate is a continuous, unpatterned, infrared radiation (IR) sensitive composition layer. The infrared radiation sensitive composition layer absorbs light in the range of from about 650 nm to about 1500 nm. Useful infrared radiation sensitive compositions comprise an infrared radiation sensitive component such as an infrared sensitive dye, infrared sensitive pigment, infrared sensitive polymer or combinations thereof. In one embodiment the infrared radiation sensitive composition comprises an infrared radiation sensitive component in admixture with a compatible polymer, solvent, or combinations thereof and coated, extruded or molded into a layer for application to the substrate. Preferably an infrared radiation sensitive component is dispersed in a polymer, preferably a transparent polymer, and an evaporable liquid such as a solvent, applied as a coating on the substrate and formed into a layer when the solvent evaporates. IR dyes are well known in the art as exemplified by U.S. Pat. Nos. 3,341,464; 3,440,257;

3,484,467; 3,575,871; and 3,670,025. In general these dyes have the property of passing light in the visible portion of the spectrum and absorbing strongly in the IR portion of the spectrum, i.e. from about 650 nanometers to about 1500 nanometers. Examples of suitable infrared radiation sensitive components which can be effectively employed are cyanine dyes, phthalocyanine dyes, metal dithiolenes, methylene blue salts, di- and triarylmethane cation salts, Wurster's blue salts, and other visibly or near infrared absorbing onium salts derived from strong acids, etc. The infrared radiation sensitive composition may be applied to a surface of the substrate, or may be incorporated into the substrate such as by molding the substrate material with the infrared radiation sensitive composition, or imbibing the infrared radiation sensitive compositions into the substrate, or by polymerizing a polymerizable monomer containing an infrared radiation sensitive composition. Useful infrared absorbing pigments nonexclusively include are carbon black, metal carbides, borides, nitrides, carbonitrides and bronze-structured oxides. A preferred infrared absorbing pigment includes carbon black. Polymers suitable for forming the infrared radiation sensitive composition include those set forth above as useful for the substrate. A solvent used is not critical provided it is substantially inert to the other layer ingredients. Useful solvents include water, alcohols, ketones such as acetone, dimethylformamide, dimethylacetamide and tetrahydrofuran. The amount of solvent is that amount which is sufficient to substantially uniformly disperse the other layer ingredients. The admixture of infrared radiation sensitive composition ingredients may be formed into a layer by applying the composition onto the substrate, and then heating the admixture until dry, for example at a temperature of from about 20° C. to about 130° C. The result is an infrared absorbing composition which is on the substrate surface. In one embodiment, the infrared radiation sensitive component is present in the overall dried infrared radiation sensitive composition in an amount of from about 0.1 weight percent to about 50 weight percent, preferably from about 0.5 weight percent to about 15 weight percent, and more preferably from about 1 weight percent to about 10 weight percent. In one embodiment, the polymer component is present in the overall dried infrared radiation sensitive composition layer in an amount of from about 5 weight percent to about 80 weight percent, preferably from about 10 weight percent to about 60 weight percent, and more preferably from about 15 weight percent to about 30 weight percent. The infrared radiation sensitive composition layer has a thickness which is at least sufficient to maintain its integrity as a uniform film. In one embodiment the infrared radiation sensitive composition layer has a thickness of from about 0.1 µm to about 2 µm, preferably from about 0.5 µm to about 1.5 µm, and more preferably from about 0.7 µm to about 1.2 µm.

Directly on the surface of the substrate or directly on the surface of the optional infrared radiation sensitive composition layer is an electrically conductive metal layer. Typically this metal layer may be applied to the substrate or IR sensitive layer by vapor or vacuum deposition, sputtering, or coating of a metal dispersed in suitable composition. A vacuum metallization process involves placing a large roll of the substrate material in a vacuum chamber which also contains a heated crucible containing a metal that is to be deposited. Under high vacuum, the heated metal vaporizes and deposits onto a moving cold web of the substrate material. The process is carried out at high speed inside a vacuum chamber. The film thickness can be adjusted from nanometer to micron thickness precisely and reproducibly. A large number of metals or even mixed metals can be deposited, offering a broad flexibility. Such metals may be any conducting metals, e.g., copper, silver, aluminum, gold, iron, nickel, tin, stainless steel, chromium, zinc, and combinations thereof. Vapor deposition techniques are well known in the art. Typically, a section of the substrate, with or without the optional infrared radiation sensitive composition layer is introduced into a commercially available vapor coating machine and vapor coated to the desired thickness with the metal. One such machine is a DENTON Vacuum DV-515 bell jar vapor coating machine. The thickness of the deposited electrically conductive metal layer is at a minimum, that amount which forms a continuous layer on the substrate. Usually the layer is thin, i.e. up to about 10 µm, preferably up to about 3 µm. More usually, the thickness of the deposited electrically conductive metal layer ranges from about 5 to about 200 nanometers (nm), for example, from about 10 to 100 nm, e.g. from about 30 to about 80 nm.

After the above article is produced, an electronic circuit is electrically connected to the electrically conductive metal layer. In one embodiment the electronic circuit is electrically connected to the electrically conductive metal layer with an electrically conducting adhesive. Any suitable electronic circuit may be used depending on the nature of the desired electronic device to be formed. Such an electronic circuit may circuitry for RDIF devices, antennae, sensors, microwave susceptors, interactive displays, electrostatic shielding devices, transponders, heating elements, and the like. The electronic circuit may be programmable such as a programmable computer chip, and/or the electronic circuit may comprise a battery or other power source. A thin battery can be pre-attached to the chip or the electrically conductive metal layer to produce active RFID devices. Such thin batteries are commercially available from Power Paper (Israel) among other suppliers. Computer chips may be attached to antennae by using an electrically conductive adhesive. Typically epoxy resins are combined with fine silver powder to make such adhesives. Such adhesives are available commercially from 3M Company and DuPont.

Then a portion of the electrically conductive metal layer is ablated with infrared laser radiation in a predetermined pattern to thereby form a pattern of electrically conductive areas and electrically non-conductive areas on the substrate. At least a portion of the electrically conductive areas is electrically connected to the electronic circuit. Preferably at least a portion of the electrically conductive areas which are electrically connected to the electronic circuit are formed between the electronic circuit and the substrate. In one embodiment a plurality of electronic circuits are electrically connected to the electrically conductive metal layer, and the ablating step comprises ablating a portion of the electrically conductive metal layer such that at least a portion of the electrically conductive areas are electrically connected to the plurality of electronic circuits.

The electrically conductive metal layer may be directly exposed to the infrared laser radiation or may be exposed through the substrate. When exposed through the substrate to the surface of the where electronic circuits such as chips are attached, the metal layer can be ablated in such a way that the electrical connections such as antenna pads are created right underneath the chip, i.e. connected to the chip connectors. This allows a precise control of chip connection to the antenna pads, thereby diminished the likelihood of misalignment and associated unreliability or waste. In a preferred embodiment the electrically conductive metal layer is exposed to the infrared laser radiation through the substrate and through the infrared radiation sensitive composition layer. The latter helps to increase productivity of the ablation process since the infrared radiation sensitive composition layer absorbs IR energy generated by IR laser and transfers this energy to the electrically conductive metal layer in the form of additional heat, helping to ablate the metal layer more efficiently and rapidly. Such thermal imaging may be carried out by well-known methods. The article may be thermally imaged with a laser or an array of lasers emitting modulated infrared radiation in a wavelength region that is absorbed by the imagable element. Infrared radiation, especially infrared radiation in the range of about 650 nm to about 1500 nm, is typically used for imaging.

Exemplary radiation emitting devices include solid state lasers, semiconductor diode lasers and lasers which are capable of providing sufficient energy to equal, or exceed, the threshold energy for ablation transfer and of providing this energy at such a rate to institute the ablative transfer process. Since the value of threshold energy is intensity dependent, as well as materials dependent, it is desirable to provide this energy as rapidly as possible. Other constituents on the exposure device include the ability to focus an image spot size which is modulated at a dwell time suitable for the desired application. Imaging may be carried out with a commercially available lasers emitting at about 830 nm, about 1056 nm, or about 1064 nm. Particularly representative devices for providing the imaging radiation include lasers such as Nd:YAG lasers emitting at 1064 nm, for example that incorporated in the imaging hardware of the Crosfield Datrax 765 laser facsimile writer, laser diode systems emitting at 780-840 nm, or other radiation sources designed to provide a power density of $10^4$ watts/cm$^2$ or greater. Other suitable commercially available imaging devices include image setters such as the Creo Trendsetter (Creo Products, Burnaby, BC, Canada), the Gerber Crescent 42T (Gerber, South Windsor, Conn., USA), and the Screen PlateRite 4300 and PlateRite 8600 (Screen, Rolling Meadows, Chicago, Ill., USA). A preferred arrangement would be to provide multiple laser light delivery heads along the width of a web of the inventive article to ablate multiple device structures at the same time. The laser energy could be delivered through a rotating mirror arrangement to achieve very fast processing speed. Any metal dust created during the ablation process can simply be vacuumed off simultaneously during laser exposure.

The resulting metal pattern or antenna has very high electrical conductivity and also capable of generating heat upon exposure to a source of microwave energy. When a programmable computer chip and a battery is attached to the metal surface in any predetermined array, prior to ablation, a fully functional and active transponder may be produced upon ablation for an appropriate antenna geometry.

The following non-limiting examples serve to illustrate the invention.

EXAMPLE 1

A 0.2 micron layer of aluminum was applied over a 50 micron thick polyethylene terephthalate (PET) film in a vacuum metallizer. The metallized PET was ablated with an IR laser from the metal side to form an image having a circular pattern. The electrical resistivity of this pattern was less then 1 ohm, which is sufficient for a typical radio-frequency antenna.

EXAMPLE 2

Example 1 was repeated except the metal layer was ablated by the IR laser from the opposite side, through the PET film, leading to same result as in Example 1.

EXAMPLE 3

A number of computer chips suitable for 13.56 MHz RFID tags were attached with an adhesive to a metallized aluminum polypropylene film, with a metal optical density less than 2.0. The structure was exposed with an IR fiber laser from Lasercut Inc. (Branford, Conn.) from the back side of the metallized film surface, i.e., the side opposite to the side containing the computer chips. The laser exposure ablated the aluminum metal precisely and cleanly to form antenna geometry for 13.56 MHz transponder. The metal could be cleanly ablated right underneath the connecting pads for the chip, such that a fully functional and flexible antenna could be formed in one single step.

While the present invention has been particularly shown and described with reference to preferred embodiments, it will be readily appreciated by those of ordinary skill in the art that various changes and modifications may be made without departing from the spirit and scope of the invention. It is intended that the claims be interpreted to cover the disclosed embodiment, those alternatives which have been discussed above and all equivalents thereto.

What is claimed is:

1. A process for producing an electronic device which comprises,
   a) providing an electrically conductive metal layer on an electrically non-conductive substrate;
   b) thereafter electrically connecting an electronic circuit to the electrically conductive metal layer, wherein the electrically conductive metal layer is between the electrically non-conductive substrate and the electronic circuit; and
   c) thereafter ablating a portion of the electrically conductive metal layer with infrared laser radiation to thereby form a pattern of electrically conductive areas and electrically non-conductive areas on the substrate, wherein at least a portion of the electrically conductive areas are electrically connected to the electronic circuit and wherein the ablating is conducted by directing the infrared laser radiation through the electrically non-conductive substrate.

2. The process of claim 1 wherein step b) comprises electrically connecting a plurality of electronic circuits to the electrically conductive metal layer, and step c) comprises ablating a portion of the electrically conductive metal layer such that at least a portion of the electrically conductive areas are electrically connected to the plurality of electronic circuits.

3. The process of claim 1 wherein the electronic circuit is programmable.

4. The process of claim 1 wherein step b) further comprises connecting a power source to the electrically conductive metal layer, and wherein step c) comprises ablating a portion of the electrically conductive metal layer such that at least a portion of the electrically conductive areas are electrically connected to the power source.

5. The process of claim 1 wherein at least a portion of the electrically conductive areas which are electrically connected to the electronic circuit are formed between the electronic circuit and the substrate.

6. The process of claim 1 wherein the pattern of electrically conductive areas form an antenna, a microwave susceptor or electrical heating element.

7. The process of claim 1 wherein the pattern of electrically conductive areas are an antenna or microwave susceptor, and the electronic circuit is a sensor.

8. The process of claim 1 wherein the pattern of electrically conductive areas are an antenna or microwave susceptor, and the electronic circuit is a transponder.

9. The process of claim 1 wherein the substrate comprises a polymer, glass or combinations thereof.

10. The process of claim 1 wherein the substrate comprises nitrocellulose, polyurethane, polyester, polyolefin, epoxy, acrylic, amide, vinyl, or combinations thereof.

11. The process of claim 1 further comprising an infrared radiation sensitive composition layer between the electrically non-conductive substrate and the electrically conductive metal layer.

12. The process of claim 11 wherein the infrared radiation sensitive composition layer comprises an infrared radiation sensitive dye, pigment, polymer or combinations thereof.

13. The process of claim 11 wherein the infrared radiation sensitive composition layer comprises carbon black, an infrared sensitive dye which absorbs light in the range of from about 650 nm to about 1500 nm, or combinations thereof.

14. The process of claim 11 wherein the ablating is conducted by directing the infrared laser radiation through the electrically non-conductive substrate and the infrared radiation sensitive composition layer.

15. The process of claim 1 wherein the electrically conductive metal layer comprises copper, silver, aluminum, gold, iron, nickel, chromium, tin, stainless steel, zinc, or combinations thereof.

16. The process of claim 1 wherein the electrically conductive metal layer has a thickness of about ten micrometers or less.

17. The process of claim 1 wherein the electrically connecting of the electronic circuit to the electrically conductive metal layer is with an electrically conducting adhesive.

\* \* \* \* \*